(12) United States Patent
Blanchard et al.

(10) Patent No.: US 8,178,379 B2
(45) Date of Patent: May 15, 2012

(54) INTEGRATED CIRCUIT, RESISTIVITY CHANGING MEMORY DEVICE, MEMORY MODULE, AND METHOD OF FABRICATING AN INTEGRATED CIRCUIT

(75) Inventors: Philippe Blanchard, Moigny sur Ecole (FR); Gill Yong Lee, Boissise-le-Roi (FR)

(73) Assignees: Qimonda AG, Munich (DE); ALTIS Semiconductor, SNC, Corbeil Essonnes (FR)

( * ) Notice: Subject to any disclaimer, the term of this patent is extended or adjusted under 35 U.S.C. 154(b) by 652 days.

(21) Appl. No.: 11/787,143

(22) Filed: Apr. 13, 2007

(65) Prior Publication Data
US 2008/0253168 A1    Oct. 16, 2008

(51) Int. Cl.
*H01L 21/00* (2006.01)
(52) U.S. Cl. ............... 438/51; 438/95; 365/148
(58) Field of Classification Search .......... 438/51, 438/95; 365/148
See application file for complete search history.

(56) References Cited

U.S. PATENT DOCUMENTS

| | | | |
|---|---|---|---|
| 6,028,335 A | 2/2000 | Okamoto et al. | |
| 6,642,153 B1 * | 11/2003 | Chang et al. | 438/725 |
| 7,037,749 B2 | 5/2006 | Horii et al. | |
| 7,050,320 B1 * | 5/2006 | Lai et al. | 365/63 |
| 7,289,350 B2 * | 10/2007 | Roehr | 365/148 |
| 7,368,314 B2 * | 5/2008 | Ufert | 438/95 |
| 7,423,282 B2 * | 9/2008 | Park et al. | 257/3 |
| 7,426,128 B2 * | 9/2008 | Scheuerlein | 365/63 |
| 7,442,605 B2 * | 10/2008 | Ufert et al. | 438/257 |
| 7,447,056 B2 * | 11/2008 | Scheuerlein et al. | 365/148 |
| 7,450,414 B2 * | 11/2008 | Scheuerlein | 365/163 |
| 7,486,537 B2 * | 2/2009 | Scheuerlein et al. | 365/148 |
| 7,557,782 B2 * | 7/2009 | Anthony et al. | 345/82 |
| 7,569,909 B2 * | 8/2009 | Huang | 257/537 |
| 2005/0029627 A1 | 2/2005 | Dennison | |
| 2005/0221200 A1 * | 10/2005 | Chen | 430/5 |
| 2005/0250281 A1 * | 11/2005 | Ufert et al. | 438/257 |
| 2006/0082526 A1 * | 4/2006 | Anthony et al. | 345/82 |
| 2006/0221663 A1 * | 10/2006 | Roehr | 365/148 |
| 2007/0007579 A1 * | 1/2007 | Scheuerlein et al. | 257/315 |
| 2007/0008773 A1 * | 1/2007 | Scheuerlein | 365/161 |
| 2007/0069276 A1 * | 3/2007 | Scheuerlein et al. | 257/314 |
| 2007/0070690 A1 * | 3/2007 | Scheuerlein et al. | 365/171 |
| 2007/0076286 A1 * | 4/2007 | Sung et al. | 359/265 |
| 2007/0264422 A1 * | 11/2007 | Zimmer | 427/127 |
| 2008/0006810 A1 * | 1/2008 | Park et al. | 257/4 |

(Continued)

FOREIGN PATENT DOCUMENTS

DE    698 06 679 T2    2/2003

(Continued)

OTHER PUBLICATIONS

Gaillard, F., et al., "Physical and optical properties of an antireflective layer based on $SiO_xN_y$," J. Vac. Sci. Technol. A, Sep./Oct. 1997, 2777-2780, vol. 15, Issue 5, American Vacuum Society.

*Primary Examiner* — Laura Menz

(57) ABSTRACT

According to one embodiment of the present invention, a memory device includes a composite structure including a resistivity changing layer and an electrode layer being arranged on or above the resistivity changing layer. The resistivity changing memory device further includes a protection layer being arranged on or above the composite structure, the protection layer protecting the electrode layer against electromagnetic waves.

16 Claims, 11 Drawing Sheets

U.S. PATENT DOCUMENTS

| | | | |
|---|---|---|---|
| 2008/0023790 A1* | 1/2008 | Scheuerlein | 257/530 |
| 2008/0025062 A1* | 1/2008 | Scheuerlein et al. | 365/105 |
| 2008/0025069 A1* | 1/2008 | Scheuerlein et al. | 365/148 |
| 2008/0025118 A1* | 1/2008 | Scheuerlein | 365/201 |
| 2008/0217670 A1* | 9/2008 | Dahmani | 257/296 |
| 2008/0231295 A1* | 9/2008 | Ruf | 324/754 |
| 2008/0253168 A1* | 10/2008 | Blanchard et al. | 365/148 |
| 2009/0045387 A1* | 2/2009 | Ufert | 257/4 |
| 2009/0072348 A1* | 3/2009 | Klostermann et al. | 257/530 |

FOREIGN PATENT DOCUMENTS

| | | |
|---|---|---|
| DE | 10 2005 047 482 A1 | 4/2007 |
| DE | 102007037245 A1 * | 10/2008 |

* cited by examiner

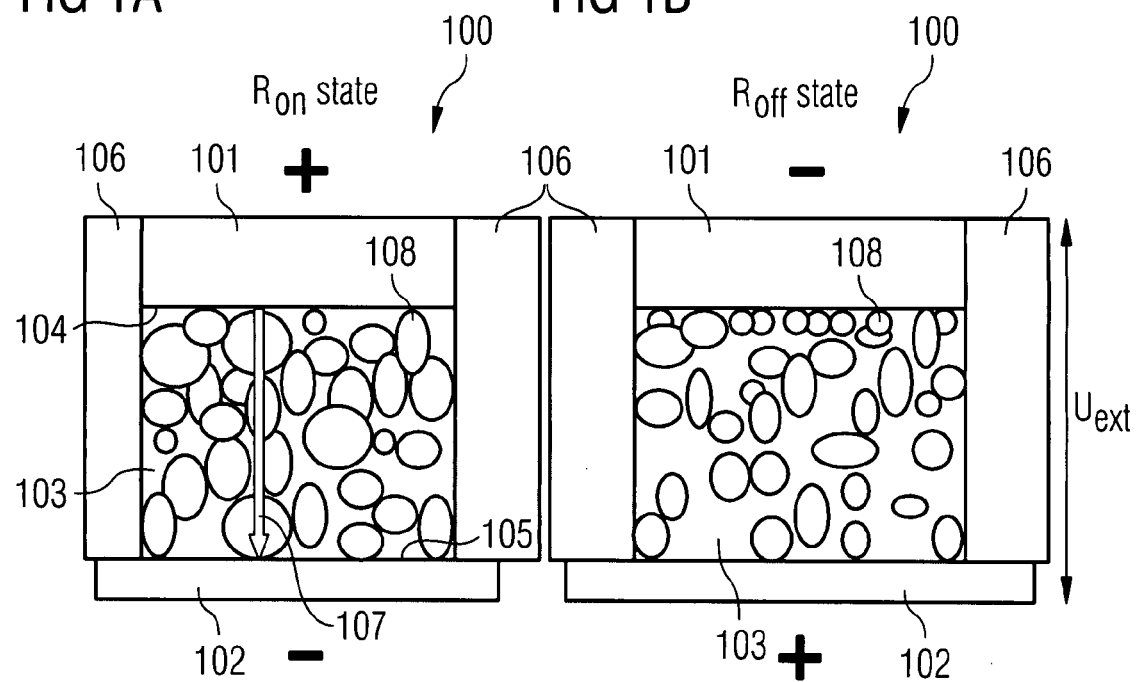
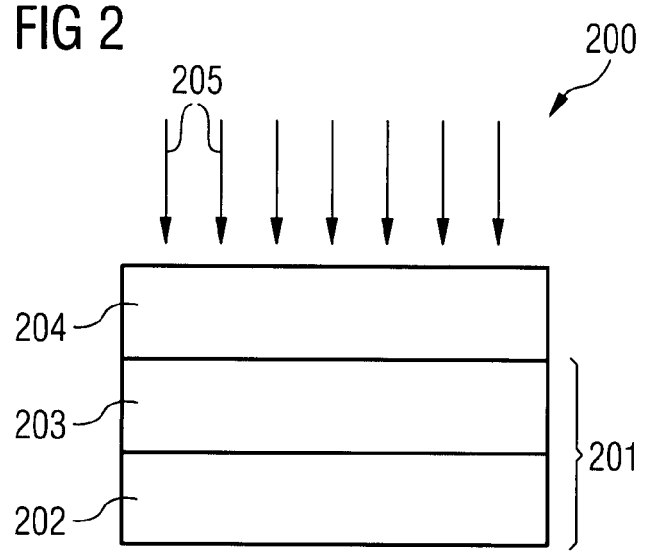

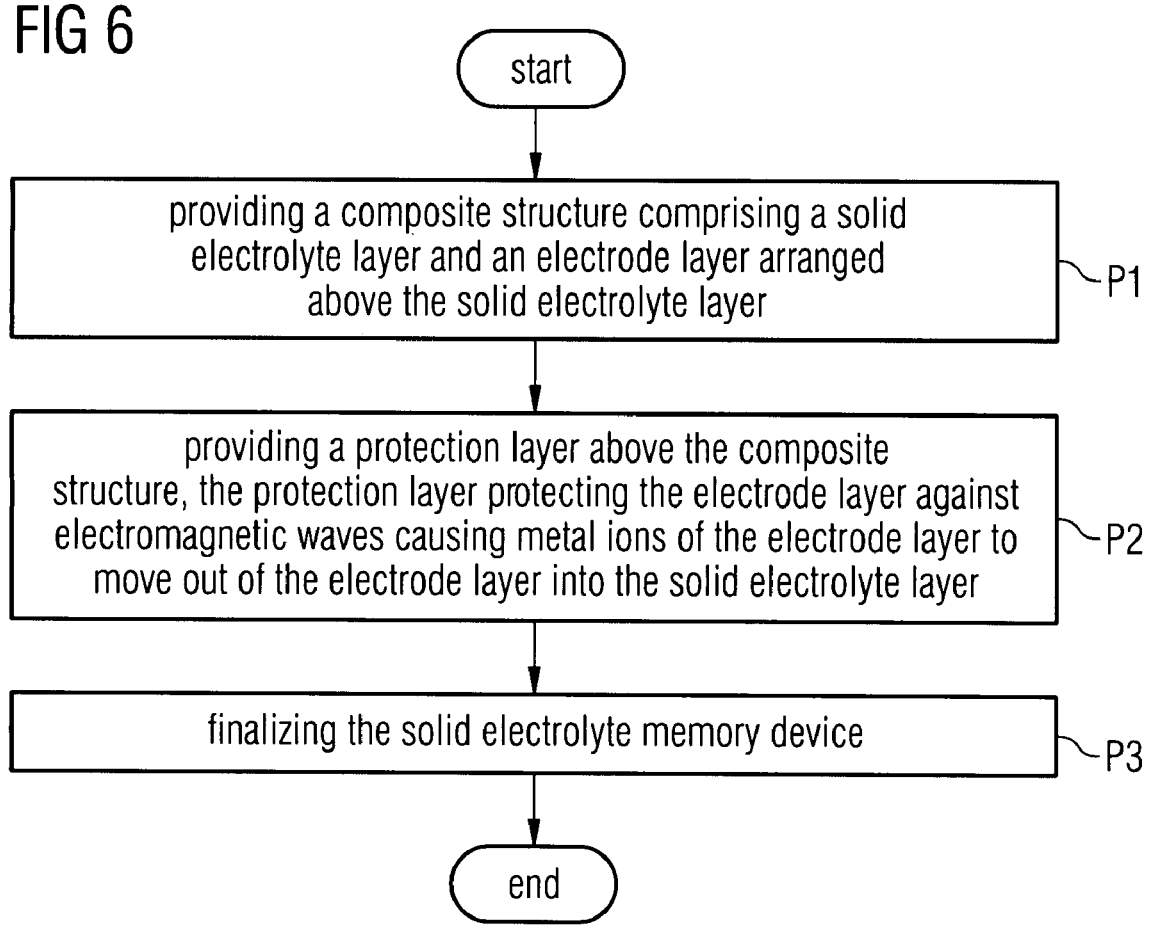

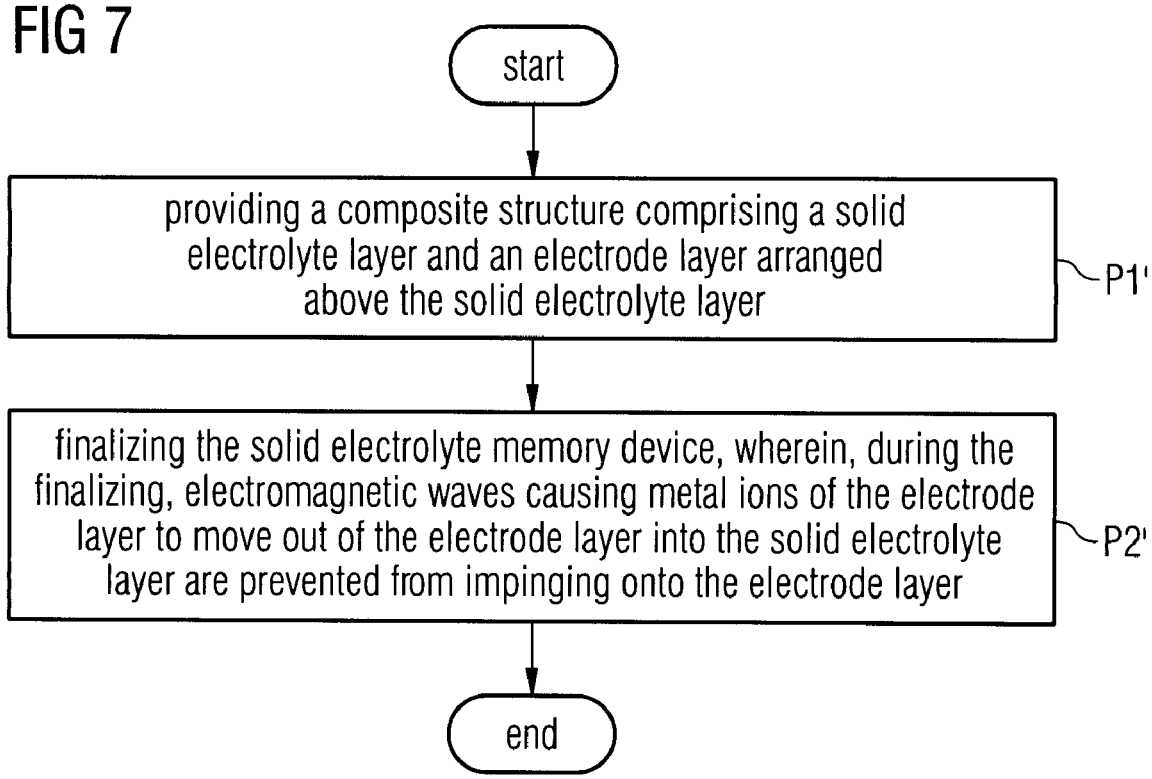
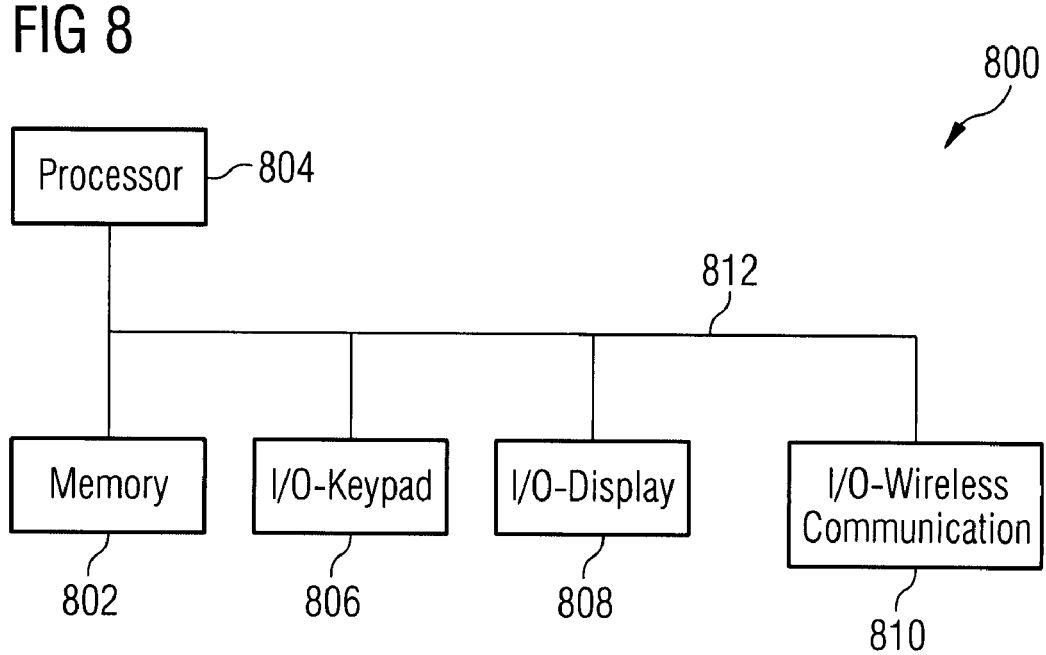

INTEGRATED CIRCUIT, RESISTIVITY CHANGING MEMORY DEVICE, MEMORY MODULE, AND METHOD OF FABRICATING AN INTEGRATED CIRCUIT

BRIEF DESCRIPTION OF THE DRAWINGS

For a more complete understanding of exemplary embodiments of the present invention and the advantages thereof, reference is now made to the following description taken in conjunction with the accompanying drawings, in which:

FIG. 1A shows a schematic cross-sectional view of a solid electrolyte memory cell set to a first memory state;

FIG. 1B shows a schematic cross-sectional view of a solid electrolyte memory cell set to a second memory state;

FIG. 2 shows a cross-sectional view of a part of a solid electrolyte memory device according to one embodiment of the present invention;

FIG. 6 shows a flow chart diagram of a fabricating method of a solid electrolyte memory device according to one embodiment of the present invention;

FIG. 7 shows a flow chart diagram of a fabricating method of a solid electrolyte memory device according to one embodiment of the present invention;

FIG. 8 shows a schematic drawing of a computing system according to one embodiment of the present invention;

DETAILED DESCRIPTION OF ILLUSTRATIVE EMBODIMENTS

Figure 3:
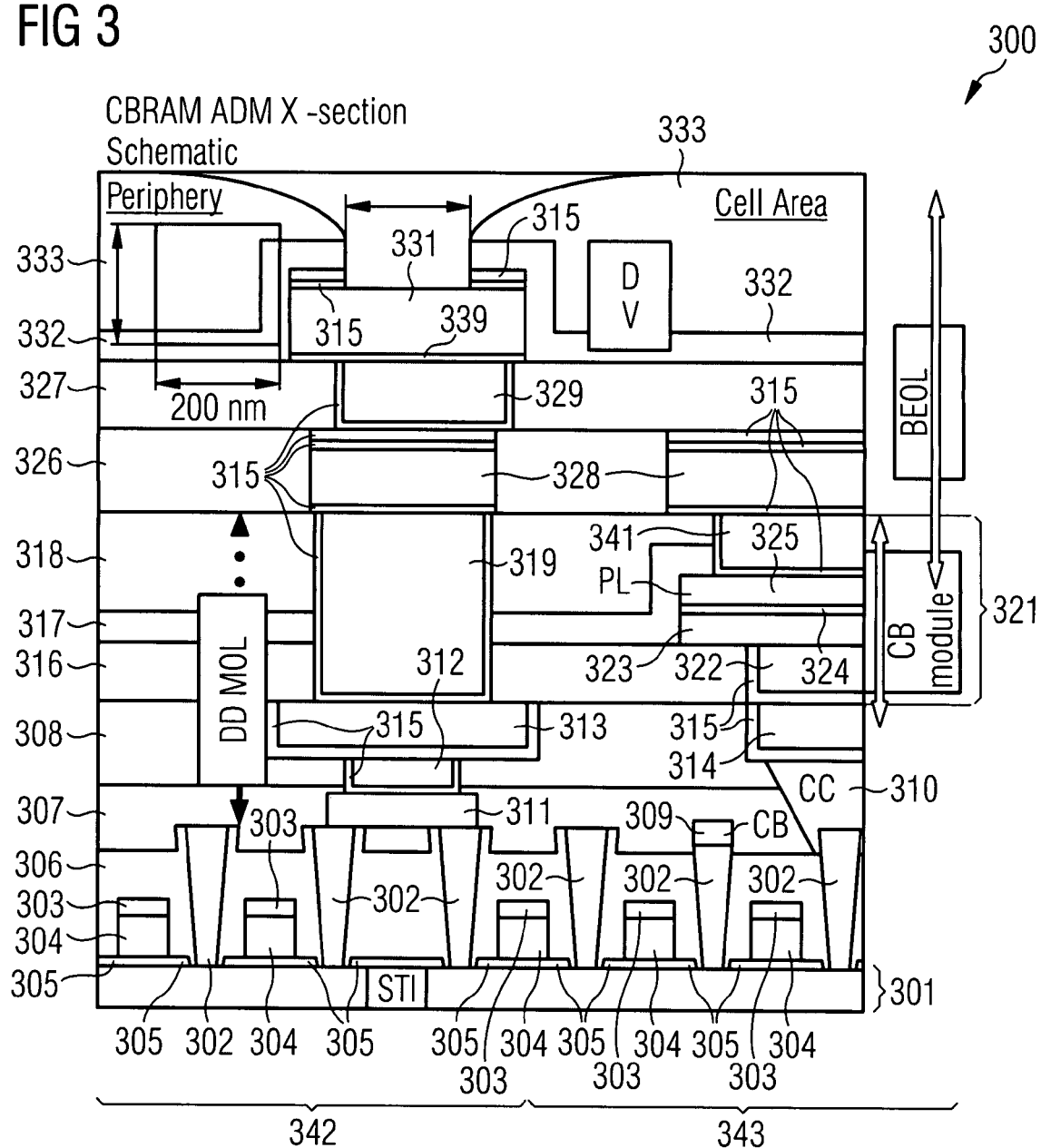
FIG. 3 shows a cross-sectional view of a part of a solid electrolyte memory device according to one embodiment of the present invention.

Within the figures, the same or corresponding areas/parts are denoted by the same reference numerals.

For sake of simplicity, it will be assumed in the following description that the resistivity changing memory device is a solid electrolyte memory device, and that the resistivity changing layer is a solid electrolyte layer. However, the present invention is not restricted thereto. The embodiments of the present invention can also be applied to other types of resistivity changing memory devices like PCRAM (phase changing random access memory) devices or ORAM (organic random access memory) devices.

According to one embodiment of the present invention, an integrated circuit having a solid electrolyte memory device is provided which includes a composite structure and a protection layer arranged on or above the composite structure. The composite structure includes a solid electrolyte layer and an electrode layer arranged on or above the solid electrolyte layer. The protection layer protects the electrode layer against electromagnetic waves.

According to one embodiment of the present invention, the protection layer protects the electrode layer against electromagnetic waves causing metal ions of the electrode layer to move out of the electrode layer into the solid electrolyte layer.

According to one embodiment of the present invention, a solid electrolyte memory device is provided which includes a composite structure and a protection layer arranged on or above the composite structure. The composite structure includes a solid electrolyte layer and an electrode layer arranged on or above the solid electrolyte layer. The protection layer protects the electrode layer against electromagnetic waves.

According to one embodiment of the present invention, the protection layer protects the electrode layer against electromagnetic waves causing metal ions of the electrode layer to move out of the electrode layer into the solid electrolyte layer.

The protection layer may for example be used to protect the electrode layer against electromagnetic waves being generated during a back end of line process (finalizing process) of the solid electrolyte memory device (e.g., against electromagnetic waves being generated during a lithographic process or an etching process using a plasma gas). Thus, the concentration of metallic material within the solid electrolyte layer will not be changed (or will be changed only slightly) during the back end of line process even if electromagnetic waves are generated. As a consequence, unpredictable changes of the concentration of metallic material within the solid electrolyte layer can be avoided which means that the reproducibility of the fabricating method is improved.

According to one embodiment of the present invention, the protection layer protects the electrode layer against electromagnetic waves having a wavelength of 150nm to 400nm.

According to one embodiment of the present invention, the protection layer protects the electrode layer against ultraviolet light.

According to one embodiment of the present invention, the protection layer absorbs at least a part of the electromagnetic waves.

According to one embodiment of the present invention, the protection layer reflects at least a part of the electromagnetic waves.

According to one embodiment of the present invention, the thickness of the protection layer ranges from 20nm to 400nm.

According to one embodiment of the present invention, the protection layer comprises $SiH_4$ and/or $N_2$.

According to one embodiment of the present invention, the protection layer is formed by a material component of an inter layer dielectric (ILD) layer being arranged on or above the composite structure.

According to one embodiment of the present invention, the protection layer has a thickness not smaller than about 20 nm.

According to one embodiment of the present invention, the protection layer has a thickness of about 25 nm.

According to one embodiment of the present invention, the protection layer is arranged on the electrode layer.

According to one embodiment of the present invention, the protection layer is arranged such that it shields at least one sidewall of the electrode layer against electromagnetic waves.

According to one embodiment of the present invention, the protection layer is arranged such that it shields at least one sidewall of the electrode layer and at least one sidewall of the solid electrolyte layer.

According to one embodiment of the present invention, the resistivity changing layer is a programmable metallization layer.

According to one embodiment of the present invention, the resistivity changing layer is a solid electrolyte layer.

According to one embodiment of the present invention, the resistivity changing layer is a phase changing layer.

According to one embodiment of the present invention, the resistivity changing layer is a carbon layer.

According to one embodiment of the present invention, a solid electrolyte memory means is provided including a composite structure means, the composite structure means having a solid electrolyte means and an electrode means arranged on or above the solid electrolyte means. The protection means is arranged on or above the composite structure means, wherein the protection means protects the electrode means against electromagnetic waves causing metal ions of the electrode means to move out of the electrode means into the solid electrolyte means.

The solid electrolyte means may for example be a solid electrolyte layer. The electrode means may for example be an electrode layer. The composite structure means may for example be a stack of several layers including a solid electrolyte layer and an electrode layer. The protection means may for example be a protection layer. The solid electrolyte memory means may for example be a solid electrolyte memory device usable as storage of a computing device.

According to one embodiment of the present invention, a memory module comprising at least one integrated circuit or at least one memory device according to one embodiment of the present invention is provided. According to one embodiment of the present invention, the memory module is stackable.

According to one embodiment of the present invention, a method of fabricating a solid electrolyte memory device is provided. The method includes providing a composite structure including a solid electrolyte layer and an electrode layer arranged on or above the solid electrolyte layer, and providing a protection layer on or above the composite structure, the protection layer protecting the electrode layer against electromagnetic waves.

According to one embodiment of the present invention, the protection layer protects the electrode layer against electromagnetic waves causing metal ions of the electrode layer to move out of the electrode layer into the solid electrolyte layer.

According to one embodiment of the present invention, a method of fabricating an integrated circuit including a solid electrolyte memory device is provided. The method includes providing a composite structure including a solid electrolyte layer and an electrode layer arranged on or above the solid electrolyte layer, and providing a protection layer on or above the composite structure, the protection layer protecting the electrode layer against electromagnetic waves.

According to one embodiment of the present invention, the protection layer protects the electrode layer against electromagnetic waves causing metal ions of the electrode layer to move out of the electrode layer into the solid electrolyte layer.

The process of finalizing the solid electrolyte memory device may for example include a back end of line fabricating process during which isolation layers, conductive layers, vias, or passivation layers are generated on or above the composite structure.

According to one embodiment of the present invention, a doping process is performed in order to dope the solid electrolyte layer with metallic material, the doping process performed before providing the protection layer.

According to one embodiment of the present invention, the doping process is performed after providing the composite structure, the doping process being based upon a photo-dissolution process which drives metal ions out of the electrode layer into the solid electrolyte layer.

According to one embodiment of the present invention, the light protection layer is provided on the composite structure immediately after having doped the solid electrolyte layer.

According to one embodiment of the present invention, the protection layer protects the electrode layer against electromagnetic waves having a wavelength of 150nm to 400nm.

According to one embodiment of the present invention, the protection layer protects the electrode layer against ultraviolet light.

According to one embodiment of the present invention, the protection layer absorbs at least a part of the electromagnetic waves.

According to one embodiment of the present invention, the protection layer reflects at least a part of the electromagnetic waves.

According to one embodiment of the present invention, the protection layer comprises or consists of $SiH_4$ and/or $N_2$.

According to one embodiment of the present invention, an inter layer dielectric (ILD) layer is provided on or above the composite structure, the ILD layer including a material component protecting the electrode layer against the electromagnetic waves.

According to one embodiment of the present invention, the protection layer has a thickness that is not smaller than about 20nm.

According to one embodiment of the present invention, the protection layer has a thickness of about 25 nm.

According to one embodiment of the present invention, the protection layer is arranged on the electrode layer.

According to one embodiment of the present invention, the protection layer is provided such that it covers the sidewalls of the electrode layer.

According to one embodiment of the present invention, the protection layer is provided such that it covers the sidewalls of the electrode layer and the solid electrolyte layer.

According to one embodiment of the present invention, a method of fabricating a solid electrolyte memory device is provided. The method includes providing a composite structure including a solid electrolyte layer and an electrode layer arranged on or above the solid electrolyte layer, and finalizing the solid electrolyte memory device, wherein, during the finalizing process, electromagnetic waves causing metal ions of the electrode layer to move out of the electrode layer into the solid electrolyte layer are prevented from impinging onto the electrode layer.

According to one embodiment of the present invention, an electronic device comprising a solid electrolyte memory device according to the present invention is provided.

Since the embodiments of the present invention can be applied to solid electrolyte devices like CBRAM (conductive bridging random access memory) devices, in the following description, making reference to FIGS. 1A and 1B, a basic principle underlying a CBRAM device in accordance with an embodiment of the invention will be explained.

As shown in FIG. 1A, a CBRAM cell 100 includes a first electrode 101, a second electrode 102, and a solid electrolyte block (in the following also referred to as an ion conductor block) 103 which includes the active material and which is sandwiched between the first electrode 101 and the second electrode 102. This solid electrolyte block 103 can also be shared between a large number of memory cells (not shown here). The first electrode 101 contacts a first surface 104 of the ion conductor block 103. The second electrode 102 contacts a second surface 105 of the ion conductor block 103. The ion conductor block 103 is isolated against its environment by an isolation structure 106. Usually, the first surface 104 is the top surface and the second surface 105 is the bottom surface of the ion conductor block 103. In the same way, generally the first electrode 101 is the top electrode and the second electrode 102 is the bottom electrode of the CBRAM cell. One of the first electrode 101 and the second electrode 102 is a reactive electrode. The other one is an inert electrode. Here, the first electrode 101 is the reactive electrode, and the second electrode 102 is the inert electrode. In this example, the first electrode 101 includes silver (Ag), the ion conductor block 103 includes silver-doped chalcogenide material, the second electrode 102 includes tungsten (W), and the isolation structure 106 includes $SiO_2$. The present invention is however not restricted to these materials. For example, the first electrode 101 may alternatively or additionally include copper (Cu) or zinc (Zn), and the ion conductor block 103 may alternatively or additionally include copper-doped chalcogenide material. Further, the second electrode 102 may alternatively or additionally include nickel (Ni) or platinum (Pt), iridium (Ir), rhenium (Re), tantalum (Ta), titanium (Ti), ruthenium (Ru), molybdenum (Mo), vanadium (V), conductive oxides, silicides, and nitrides of the aforementioned compounds, and can also include alloys of the aforementioned metals or materials. The thickness of the ion conductor block 103 may for example range between 5 nm and 500 nm. The thickness of the first electrode 101 may for example range between 10 nm and 100 nm. The thickness of the second electrode 102 may for example range between 5 nm and 500 nm, between 15 nm to 150 nm, or between 25 nm and 100 nm. It is to be understood that the present invention is not restricted to the above-mentioned materials and thicknesses.

In the context of this description, chalcogenide (ion conducting) material is to be understood for example as any compound containing oxygen, sulphur, selenium, germanium and/or tellurium. In accordance with one embodiment of the invention, the ion conducting material is for example a compound, which is made of a chalcogenide and at least one metal of group I or group II of the periodic system, for example arsenic-trisulfide-silver. Alternatively, the chalcogenide material contains germanium-sulfide (GeSx), germanium-selenide (GeSe), tungsten oxide (WOx), copper sulfide (CuSx) or the like. The ion conducting material may be a solid state electrolyte. Furthermore, the ion conducting material can be made of a chalcogenide material containing metal ions, wherein the metal ions can be made of a metal, which is selected from a group consisting of silver, copper and zinc or of a combination or an alloy of these metals.

If a voltage as indicated in FIG. 1A is applied across the ion conductor block 103, a redox reaction is initiated which drives Ag+ ions out of the first electrode 101 into the ion conductor block 103 where they are reduced to Ag, thereby forming Ag rich clusters 108 within the ion conductor block 103. If the voltage applied across the ion conductor block 103 is applied for an enhanced period of time, the size and the number of Ag rich clusters 108 within the ion conductor block 103 is increased to such an extent that a conductive bridge 107 between the first electrode 101 and the second electrode 102 is formed. If a voltage is applied across the ion conductor block 103 as shown in FIG. 1B (inverse voltage compared to the voltage applied in FIG. 1A), a redox reaction is initiated which drives Ag+ ions out of the ion conductor block 103 into the first electrode 101 where they are reduced to Ag. As a consequence, the size and the number of Ag rich clusters 108 within the ion conductor block 103 is reduced, thereby erasing the conductive bridge 107. After having applied the voltage/inverse voltage, the memory cell 100 remains within the corresponding defined switching state even if the voltage/inverse voltage has been removed.

In order to determine the current memory status of a CBRAM cell, a sensing current is routed through the CBRAM cell. The sensing current experiences a high resistance when no conductive bridge 107 exists within the CBRAM cell and experiences a low resistance when a conductive bridge 107 exists within the CBRAM cell. A high resistance may for example represent "0," whereas a low resistance represents "1," or vice versa. The memory status detection may also be carried out using sensing voltages.

FIG. 2 shows a cross-sectional view of a part of a solid electrolyte memory device according to one embodiment of the present invention. A solid electrolyte memory device 200 includes a composite structure 201 including a solid electrolyte layer 202 and an electrode layer 203 arranged above the solid electrolyte layer 202. Further, the solid electrolyte memory device 200 comprises a protection layer 204 arranged above the composite structure 201. The protection layer 204 protects the electrode layer 203 for example against electromagnetic waves 205 which propagate towards the electrode layer 203 in a direction indicated by the arrows in FIG. 2. The protection layer 204 may for example completely or partially absorb or reflect the electromagnetic waves 205 so that no or only a few metal ions of the electrode layer 203 are caused to move out of the electrode layer 203 into the solid electrolyte layer 202.

According to one embodiment of the present invention, the protection layer 204 converts electromagnetic waves having a first frequency to electromagnetic waves having a second frequency, wherein the electromagnetic waves having the second frequency are not strong enough to cause metal ions of the electrode layer 203 to move into the solid electrolyte layer 202. For example, the protection layer 204 may convert ultraviolet light components of the electromagnetic waves 205 into visible light components. Additional layers may be provided between the electrode layer 203 and the solid electrolyte layer 202 as well as between the protection layer 204 and the electrode layer 203.

FIG. 3 shows an embodiment of a solid electrolyte memory device. A solid electrolyte memory device 300 includes a semiconductor substrate 301, above which first vias 302, word lines 303, gate electrodes 304, first isolation elements 305 and a first isolation layer 306 are provided. The first vias 302, word lines 303 and gate electrodes 304 are embedded into the first isolation layer 306 in order to isolate the first vias 302, word lines 303 and gate electrodes 304 against each other. The first isolation elements 305 isolate the gate electrodes 304 against the semiconductor substrate 301.

The solid electrolyte memory device 300 further comprises a second isolation layer 307 and a third isolation layer 308 arranged in this order on the first isolation layer 306. Bit lines 309 which contact first vias 302, second vias 310, a first wiring layer 311, a first plug 312, a second plug 313, and a third plug 314 are embedded into the second isolation layer 307 and the third isolation layer 308. The first plug 312, the second plug 313, and the third plug 314 are partly surrounded by interface material 315 which may be adhesive material and/or conductive material and/or insulating material. A fourth isolation layer 316, a fifth isolation layer 317, and a sixth isolation layer 318 are arranged on the third isolation layer 308 in this order. A third via 319 partially surrounded by interface material 315 (for example tantalum or tantalum nitride (Ta/TaN)) is embedded into the composite structure formed by the fourth isolation layer 316, the fifth isolation layer 317, and the sixth isolation layer 318. Further, a solid electrolyte cell unit 321 is embedded into said composite structure. The solid electrolyte cell unit 321 comprises a fourth plug 322 functioning as a bottom electrode of the solid electrolyte cell unit 321 and being partially surrounded by interface material 315, a layer of active material 323 (for example chalcogenide material), a common top electrode layer 324 (for example, a silver layer) arranged on the active material layer 323, a common contacting layer 325 arranged on the common top electrode layer 324, and a fifth plug 341 being arranged on the common contacting layer 325 and being partially surrounded by the interface material 315. A seventh isolation layer 326 and an eighth isolation layer 327 are arranged on the sixth isolation layer 318 in this order. A second wiring layer 328 is embedded into the seventh isolation layer 326 and is partially surrounded by interface material 315. A sixth plug 329 is embedded into the eighth isolation layer 327 and is partially surrounded by interface material 315. A third wiring layer 331 is arranged on the eighth isolation layer 327 and is partially surrounded by interface material 315. The upper surface of the eighth isolation layer 327 as well as parts of the surface of the third wiring layer 331 are covered with a ninth isolation layer 332 and a tenth isolation layer 333.

The third wiring layer 331, the sixth plug 329, the second wiring layer 328, the third via 319, the second plug 313, the first plug 312, the first wiring layer 311, and some of the first vias 302 may be connected in a way that a conductive line is formed which guides electric currents between the semiconductor substrate 301 of the solid electrolyte memory device 300 and a substrate voltage/current terminal which is formed by the upper surface of the third wiring layer 331.

The fifth plug 341 and the second wiring layer 328 may be connected in a way that a conductive line is formed which guides electric currents or voltages between the common contacting layer 325 and a memory cell programming unit (not shown here) programming memory states of the memory cells or between the common contacting layer 325 and a memory cell reading unit (not shown here) determining the memory state of the memory cells. For sake of simplicity, only one fifth plug 341 is shown. However, a plurality of fifth plugs 341 may be provided, each fifth plug 341 being part of a conductive line guiding electric currents or voltages between the common contacting layer 325 and a memory cell programming unit/a memory cell reading unit. Further, the common contacting layer 325 and the common top electrode layer 324 may be patterned.

The third wiring layer 331, the sixth plug 329, the second wiring layer 328, the third via 319, the second plug 313, the first plug 312, and the first wiring layer 311 are located within a peripheral area 342 of the solid electrolyte memory device 300, whereas the fifth plug 341 and the second wiring layer 328 are located within a cell area 343 of the solid electrolyte memory device 300.

Figure 4A:
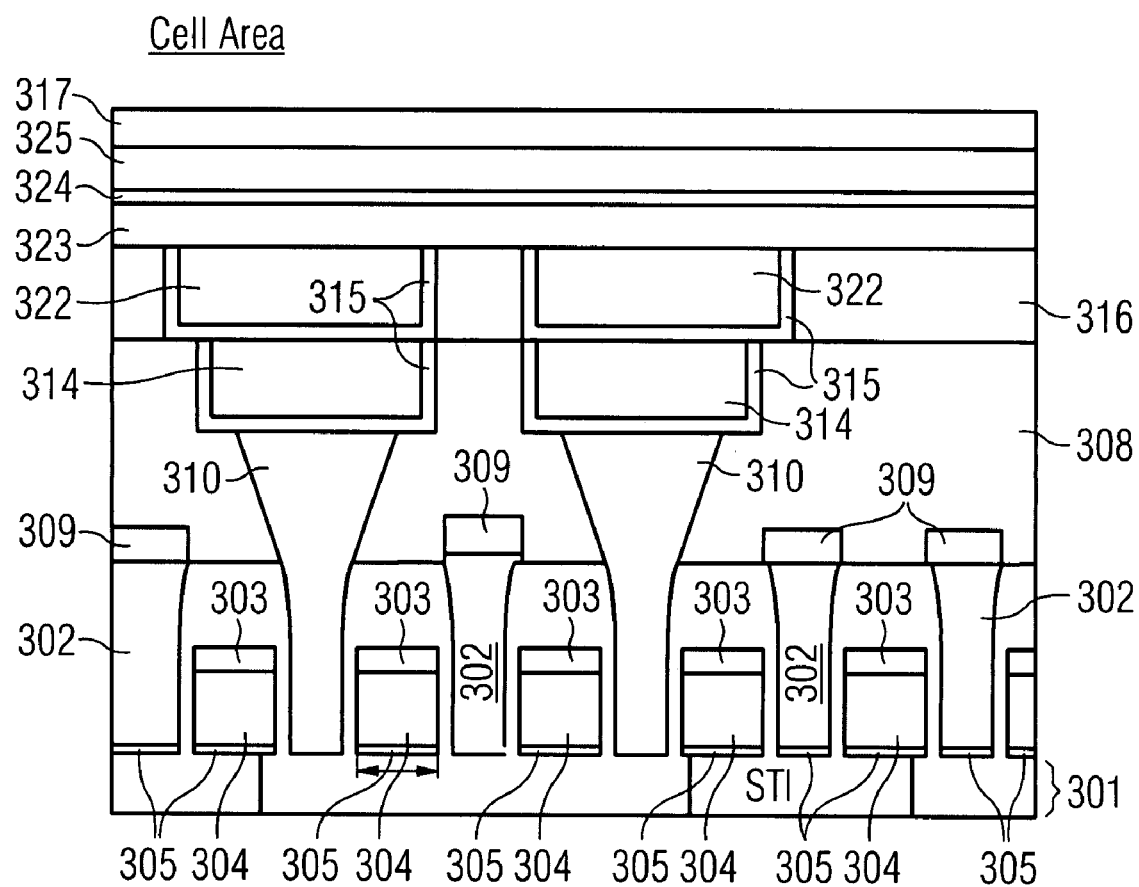
FIG. 4A shows a schematic cross-sectional view of a fabricating stage of a method of fabricating a solid electrolyte memory device according to one embodiment of the present invention.

FIG. 4A shows a processing stage of a method of fabricating the solid electrolyte memory device 300 shown in FIG. 3 according to one embodiment of the present invention. FIG. 4A shows a part of the cell area 343 of the solid electrolyte memory device 300 to be fabricated. In the processing stage shown in FIG. 4A, the fifth isolation (protection) layer 317 has been provided on the layers 324, 325. According to one embodiment of the present invention, the protection layer 317 protects the layers 324, 325 against electromagnetic waves having a wavelength lying between 150nm to 400nm. According to one embodiment of the present invention, the protection layer 317 protects the layers 324, 325 against ultraviolet light. According to one embodiment of the present invention, the protection layer 317 absorbs at least a part of the electromagnetic waves impinging on the protection layer 317. According to one embodiment of the present invention, the protection layer 317 reflects at least a part of the electromagnetic waves impinging on the protection layer 317. According to one embodiment of the present invention, the protection layer 317 includes or consists of $SiH_4$ and/or $N_2$. According to one embodiment of the present invention, the protection layer 317 is formed by a material component of an inter layer dielectric (ILD) layer. That is, the protection layer 317 is an ILD layer which is additionally used as a protection layer. According to one embodiment of the present invention, the thickness of the protection layer 317 is not smaller than 20 nm. According to one embodiment of the present invention, the thickness of the protection layer 317 is 25 nm.

Figure 4B:
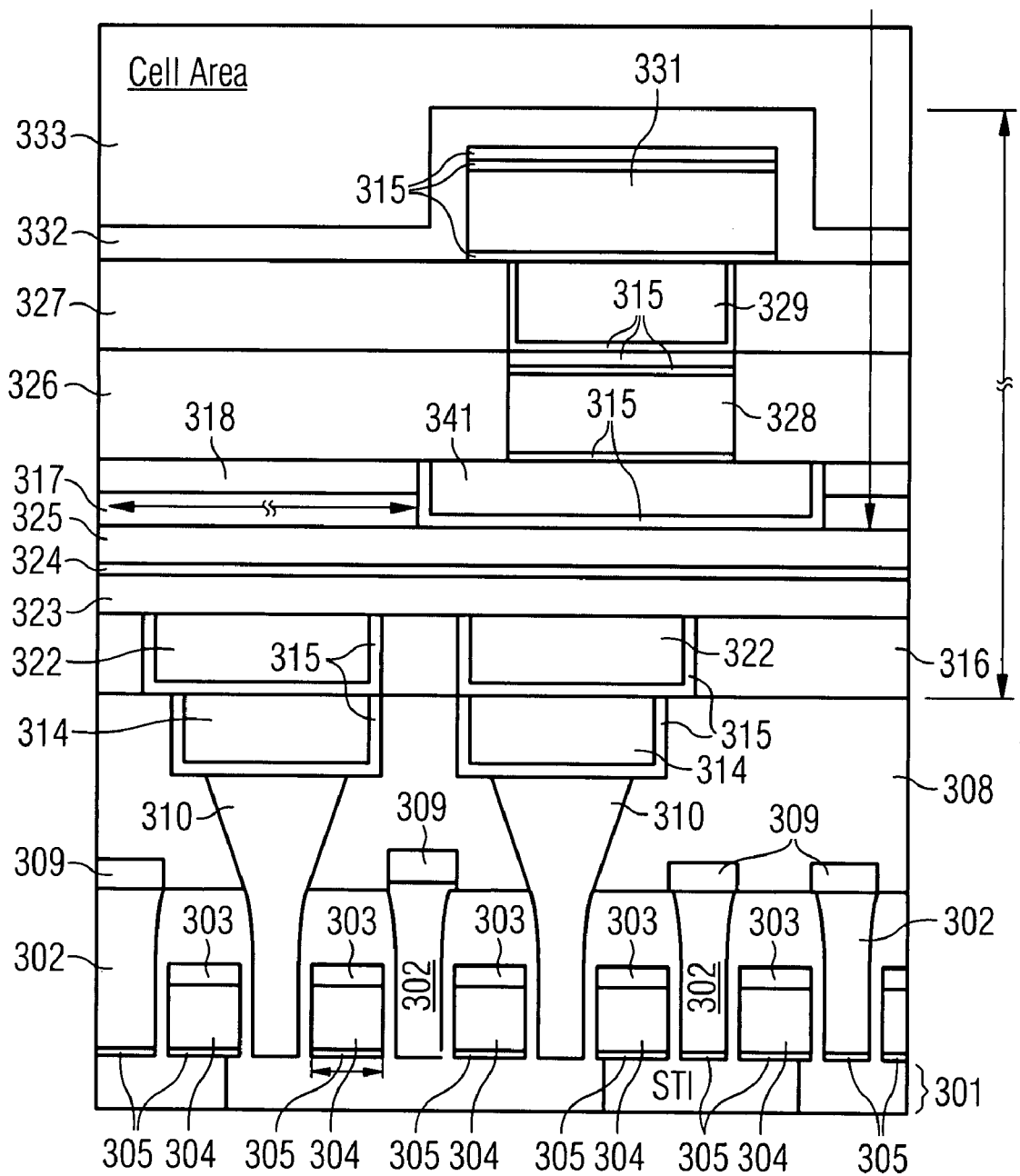
FIG. 4B shows a schematic cross-sectional view of a fabricating stage of a method of fabricating a solid electrolyte memory device according to one embodiment of the present invention.

After depositing the protection layer 317, a back end of line (BEOL) process is carried out, thereby reaching the fabricating stage shown in FIG. 4B (the solid electrolyte memory device 300 is completed).

Figure 5A:
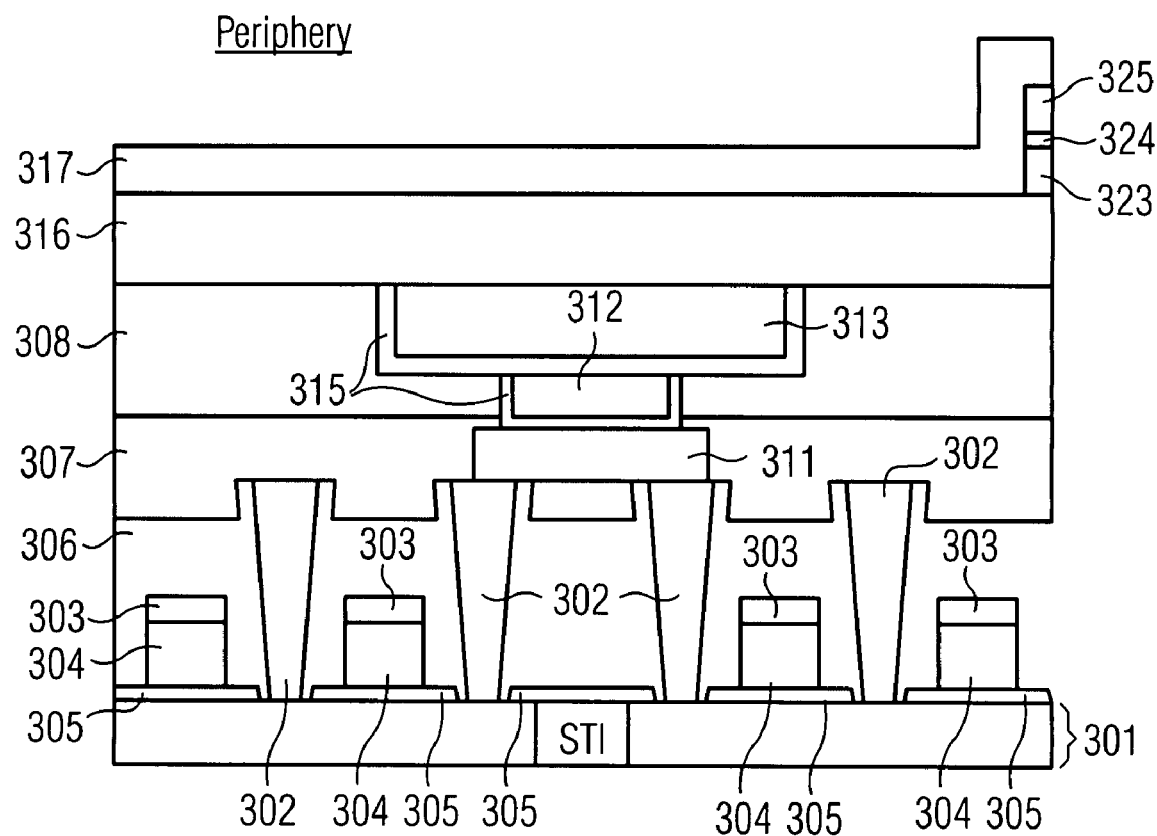
FIG. 5A shows a schematic cross-sectional view of a fabricating stage of a method of fabricating a solid electrolyte memory device according to one embodiment of the present invention.

FIG. 5A shows a processing stage of a method of fabricating the solid electrolyte memory device 300 shown in FIG. 3 according to one embodiment of the present invention. FIG. 5A shows a part of the peripheral area 342 of the solid electrolyte memory device 300 to be fabricated. In the processing stage shown in FIG. 5A, the protection layer 317 has been provided on the fourth isolation layer 316. The protection layer 317 is arranged such that it shields the sidewalls of the electrode layer 324, the contacting layer 325, and the active material layer 323. The protection layer 317 shown in FIG. 5A may have the same properties as the protection layer 317 shown in FIG. 4A.

Figure 5B:
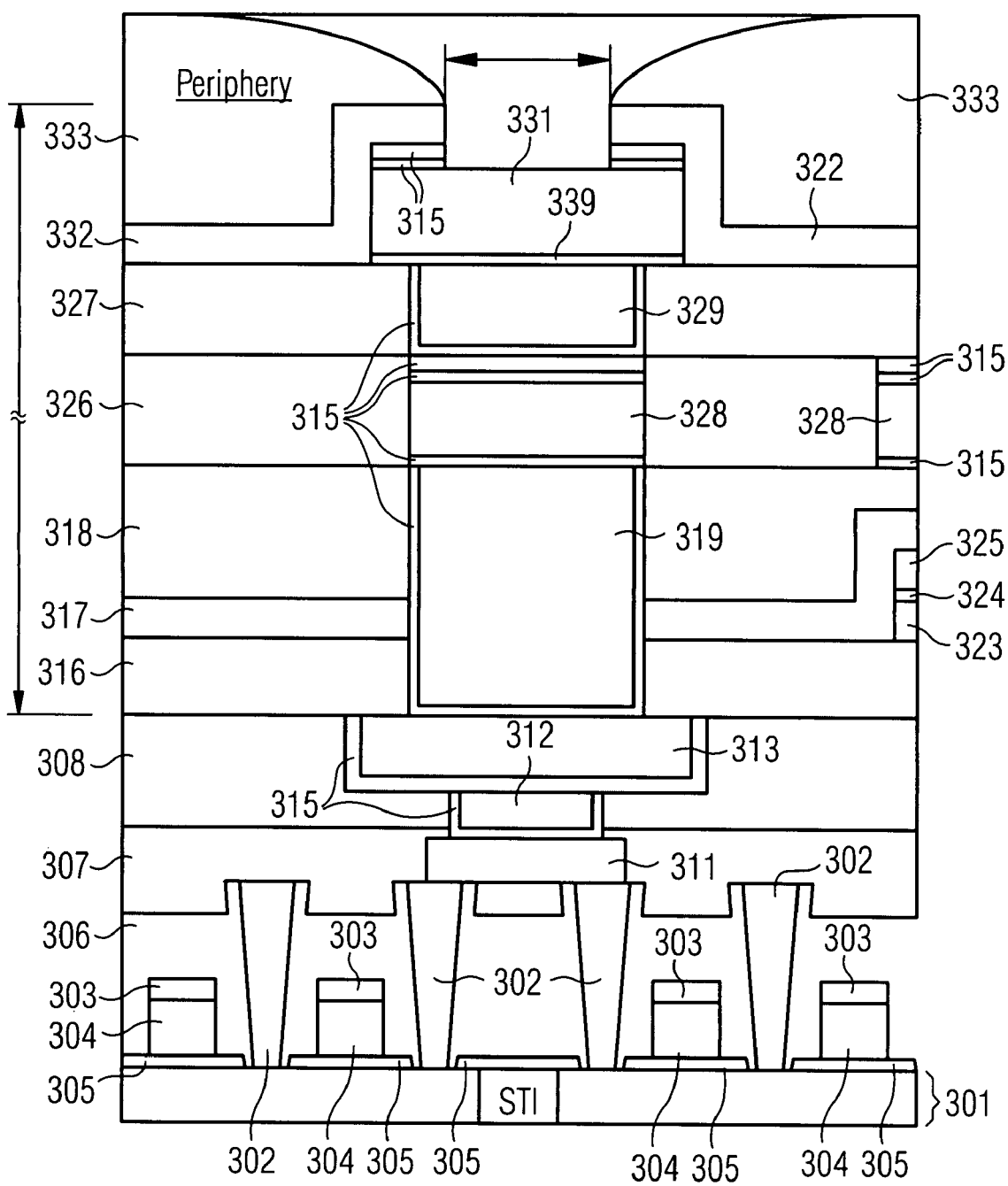
FIG. 5B shows a schematic cross-sectional view of a fabricating stage of a method of fabricating a solid electrolyte memory device according to one embodiment of the present invention.

After depositing the protection layer 317 (for example, using a CVD (chemical vapor deposition) process or a PVD (physical vapor deposition) process), a back end of line (BEOL) process is carried out, thereby reaching the fabricating stage shown in FIG. 5B (the solid electrolyte memory device 300 is completed).

FIG. 6 shows a flow chart diagram of a method of fabricating a solid electrolyte memory device according to one embodiment of the present invention.

In a first process P1, a composite structure is provided including a solid electrolyte layer and an electrode layer arranged above the solid electrolyte layer. Then, in a second process P2, a protection layer is provided above the composite structure, the protection layer protecting the electrode layer against electromagnetic waves causing metal ions of the electrode layer to move out of the electrode layer into the solid electrolyte layer. In a third process P3, the solid electrolyte memory device is finalized.

FIG. 7 shows a flow chart diagram of a method of fabricating a solid electrolyte memory device according to one embodiment of the present invention. In a first step P1', a composite structure including a solid electrolyte layer and an electrode layer arranged above the solid electrolyte layer is provided. In a second step P2', the solid electrolyte memory device is finalized, wherein, during the finalizing, electromagnetic waves causing metal ions of the electrode layer to move out of the electrode layer into the solid electrolyte layer are prevented from impinging onto the electrode layer.

FIG. 8 shows an example computing system that uses a memory device/integrated circuit constructed of memory cells in accordance with the invention. The computing system 800 includes a memory device 802, which may utilize memory cells in accordance with the invention. The system also includes a processor 804, and one or more input/output devices, such as a keypad 806, display 808, and wireless communication device 810. The memory device 802, processor 804, keypad 806, display 808 and wireless communication device 810 are interconnected by a bus 812.

The wireless communication device 810 may include circuitry (not shown) for sending and receiving transmissions over a cellular telephone network, a WiFi wireless network, or other wireless communication network. It will be understood that the variety of input/output devices shown in FIG. 8 is merely an example, in which the computing system 800 may be configured as a cellular telephone or other wireless communications device. Memory devices/integrated circuits including memory cells in accordance with the invention may be used in a wide variety of systems. Alternative system designs may include different input/output devices, multiple processors, alternative bus configurations, and many other configurations.

Figure 9A:
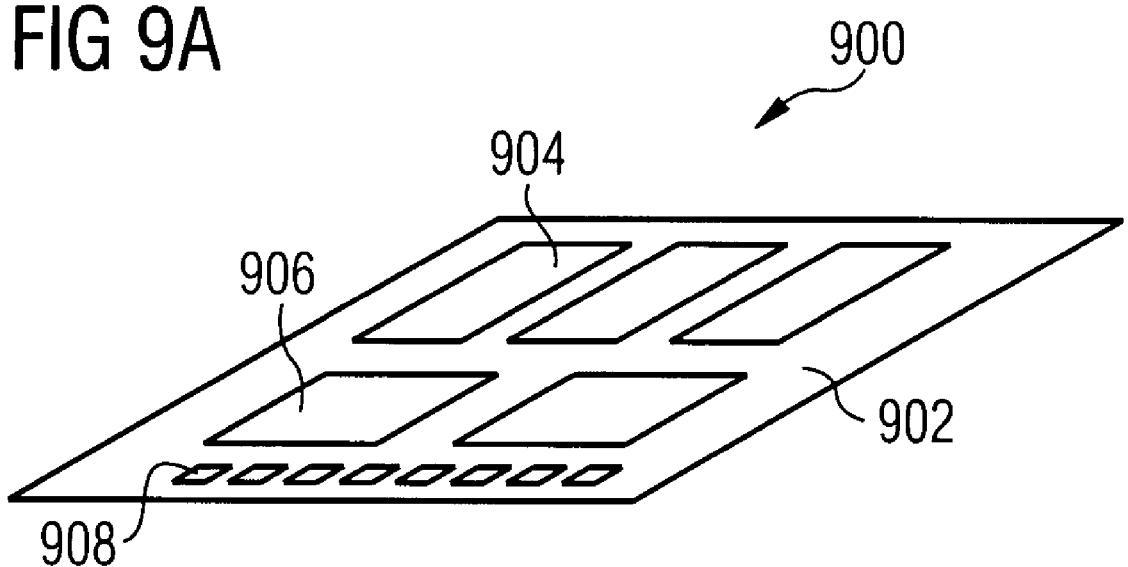
FIG. 9A shows a schematic drawing of a memory module according to one embodiment of the present invention.
Figure 9B:
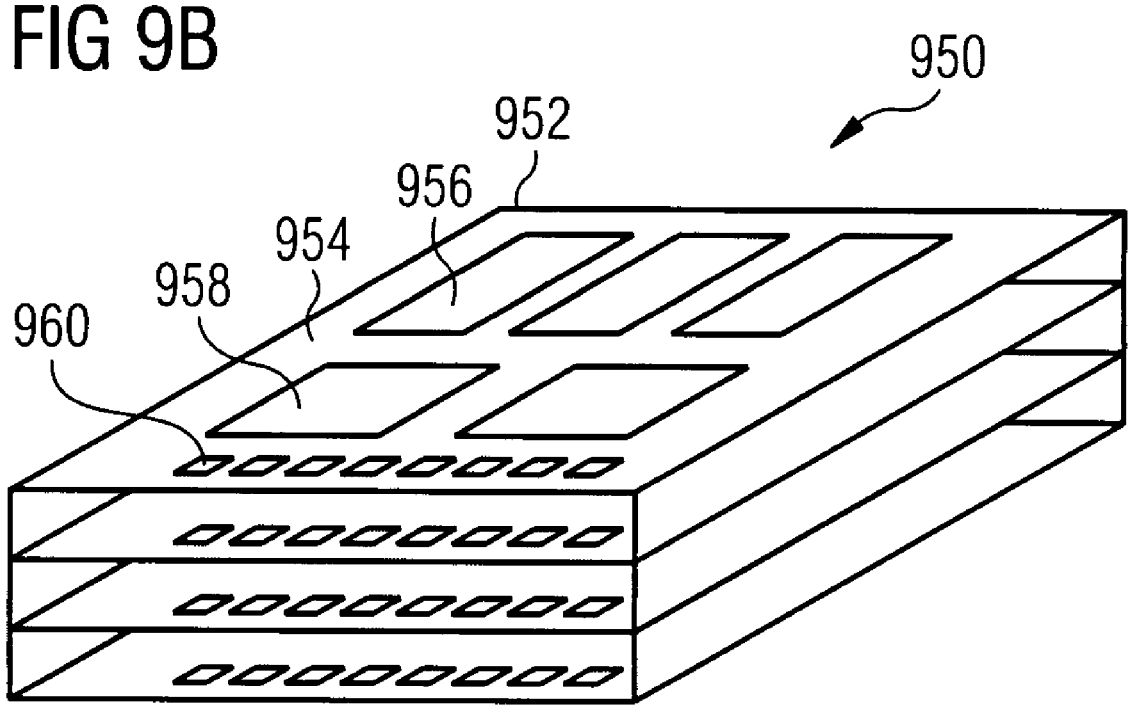
FIG. 9B shows a schematic drawing of a memory module according to one embodiment of the present invention.

As shown in FIGS. 9A and 9B, in some embodiments, memory devices/integrated circuits such as those described herein may be used in modules. In FIG. 9A, a memory module 900 is shown, on which one or more memory devices/integrated circuits 904 according to one embodiment of the present invention are arranged on a substrate 902. The memory device/integrated circuits 904 may include numerous memory cells. The memory module 900 may also include one or more electronic devices 906, which may include memory, processing circuitry, control circuitry, addressing circuitry, bus interconnection circuitry, or other circuitry or electronic devices that may be combined on a module with a memory device, such as the memory device/integrated circuit 904. Additionally, the memory module 900 includes multiple electrical connections 908, which may be used to connect the memory module 900 to other electronic components, including other modules.

As shown in FIG. 9B, in some embodiments, these modules may be stackable, to form a stack 950. For example, a stackable memory module 952 may contain one or more memory devices 956, arranged on a stackable substrate 954. The memory devices 956 contain memory cells that employ memory elements in accordance with an embodiment of the invention. The stackable memory module 952 may also include one or more electronic devices 958, which may include memory, processing circuitry, control circuitry, addressing circuitry, bus interconnection circuitry, or other circuitry or electronic devices that may be combined on a module with a memory device, such as the memory device 956. Electrical connections 960 are used to connect the stackable memory module 952 with other modules in the stack 950 or with other electronic devices. Other modules in the stack 950 may include additional stackable memory modules, similar to the stackable memory module 952 described above, or other types of stackable modules, such as stackable processing modules, control modules, communication modules, or other modules containing electronic components.

According to one embodiment of the invention, resistivity changing memory cells are phase changing memory cells that include a phase changing material. The phase changing material can be switched between at least two different crystallization states (i.e., the phase changing material may adopt at least two different degrees of crystallization), wherein each crystallization state may be used to represent a memory state. When the number of possible crystallization states is two, the crystallization state having a high degree of crystallization is also referred to as "crystalline state," whereas the crystallization state having a low degree of crystallization is also referred to as "amorphous state." Different crystallization states can be distinguished from each other by their differing electrical properties, and in particular by their different resistances. For example, a crystallization state having a high degree of crystallization (ordered atomic structure) generally has a lower resistance than a crystallization state having a low degree of crystallization (disordered atomic structure). For sake of simplicity, it will be assumed in the following description that the phase changing material can adopt two crystallization states (i.e., an "amorphous state" and a "crystalline state"), however it will be understood that additional intermediate states may also be used.

Phase changing memory cells may change from the amorphous state to the crystalline state (and vice versa) due to temperature changes of the phase changing material. These temperature changes may be caused using different approaches. For example, a current may be driven through the phase changing material (or a voltage may be applied across the phase changing material). Alternatively, a current or a voltage may be fed to a resistive heater which is disposed adjacent to the phase changing material. To determine the memory state of a resistivity changing memory cell, a sensing current may be routed through the phase changing material (or a sensing voltage may be applied across the phase changing material), thereby sensing the resistivity of the resistivity changing memory cell, which represents the memory state of the memory cell.

Figure 10:
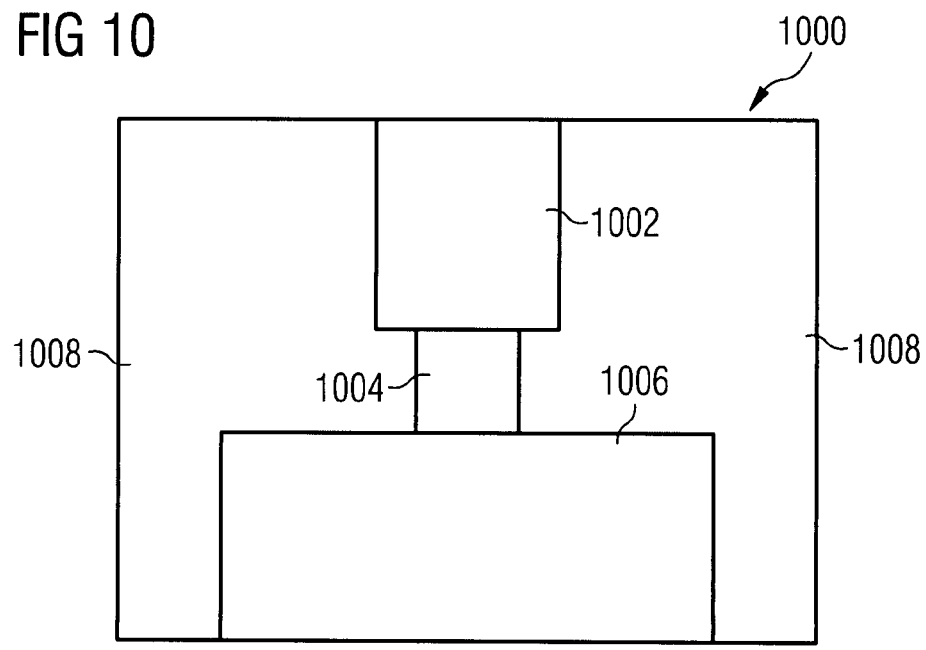
FIG. 10 shows a cross-sectional view of a phase changing memory cell.

FIG. 10 illustrates a cross-sectional view of an exemplary phase changing memory cell 1000 (active-in-via type). The phase changing memory cell 1000 includes a first electrode 1006, a phase changing material 1004, a second electrode 1002, and an insulating material 1008. The phase changing material 1004 is laterally enclosed by the insulating material 1008. To use the phase changing memory cell in a memory cell, a selection device (not shown), such as a transistor, a diode, or another active device, may be coupled to the first electrode 1006 or to the second electrode 1002 to control the application of a current or a voltage to the phase changing material 1004 via the first electrode 1006 and/or the second electrode 1002. To set the phase changing material 1004 to the crystalline state, a current pulse and/or voltage pulse may be applied to the phase changing material 1004, wherein the pulse parameters are chosen such that the phase changing material 1004 is heated above its crystallization temperature, while keeping the temperature below the melting temperature of the phase changing material 1004. To set the phase changing material 1004 to the amorphous state, a current pulse and/or voltage pulse may be applied to the phase changing material 1004, wherein the pulse parameters are chosen such that the phase changing material 1004 is quickly heated above its melting temperature, and then quickly cooled.

The phase changing material 1004 may include a variety of materials. According to one embodiment, the phase changing material 1004 may include or consist of a chalcogenide alloy that includes one or more cells from group VI of the periodic table. According to another embodiment, the phase changing material 1004 may include or consist of a chalcogenide compound material, such as GeSbTe, SbTe, GeTe or AgInSbTe. According to a further embodiment, the phase changing material 1004 may include or consist of chalcogen free material, such as GeSb, GaSb, InSb, or GeGaInSb. According to still another embodiment, the phase changing material 1004 may include or consist of any suitable material including one or more of the elements Ge, Sb, Te, Ga, Bi, Pb, Sn, Si, P, O, As, In, Se, and S.

According to one embodiment, at least one of the first electrode 1006 and the second electrode 1002 may include or consist of Ti, V, Cr. Zr, Nb, Mo, Hf, Ta, W, or mixtures or alloys thereof. According to another embodiment, at least one of the first electrode 1006 and the second electrode 1002 may include or consist of Ti, V, Cr, Zr, Nb, Mo, Hf, Ta, W and two or more elements selected from the group consisting of B, C, N, O, Al, Si, P, S, and/or mixtures and alloys thereof. Examples of such materials include TiCN, TiAlN, TiSiN, W—$Al_2O_3$ and Cr—$Al_2O_3$.

Figure 11:
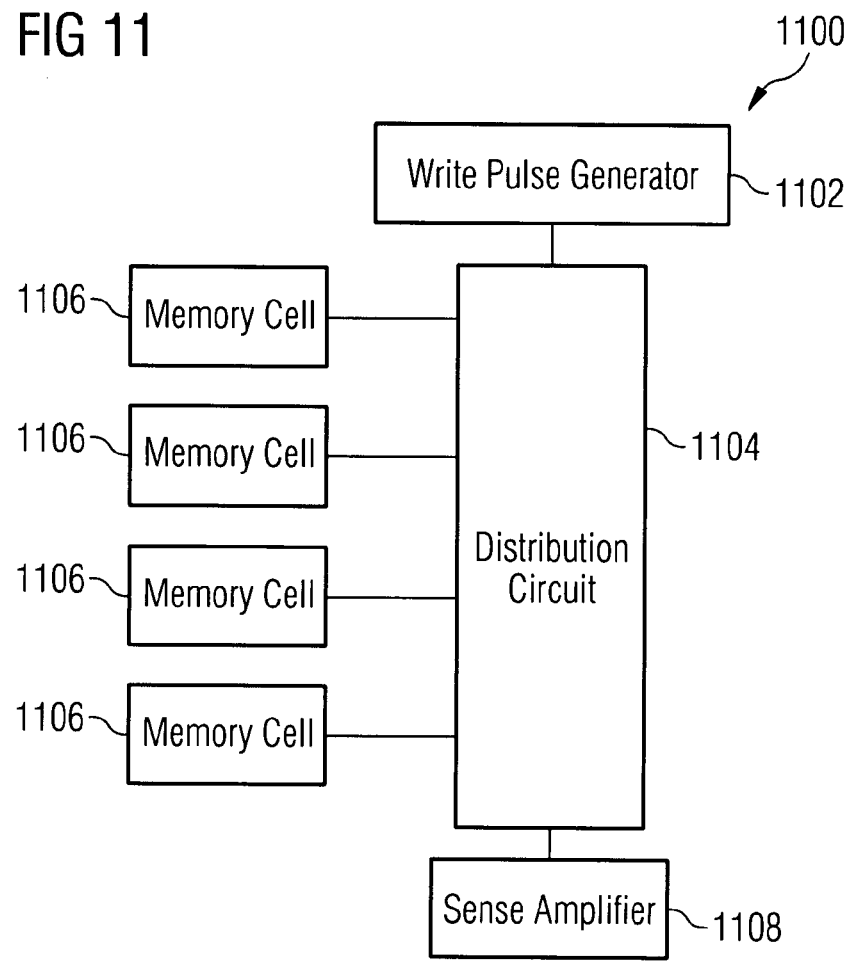
FIG. 11 shows a schematic drawing of a memory device including resistivity changing memory cells.

FIG. 11 illustrates a block diagram of a memory device 1100 including a write pulse generator 1102, a distribution circuit 1104, phase changing memory cells 1106 (for example, phase changing memory cells 200 as shown in FIG. 2), and a sense amplifier 1108. According to one embodiment, a write pulse generator 1102 generates current pulses or voltage pulses that are supplied to the phase changing memory cells 1106 via the distribution circuit 1104, thereby programming the memory states of the phase changing memory cells 1106. According to one embodiment, the distribution circuit 1104 includes a plurality of transistors that supply direct current pulses or direct voltage pulses to the phase changing memory cells 1106 or to heaters being disposed adjacent to the phase changing memory cells 1106.

As already indicated, the phase changing material of the phase changing memory cells 1106 may be changed from the amorphous state to the crystalline state (or vice versa) under the influence of a temperature change. More generally, the phase changing material may be changed from a first degree of crystallization to a second degree of crystallization (or vice versa) under the influence of a temperature change. For example, a bit value "0" may be assigned to the first (low) degree of crystallization, and a bit value "1" may be assigned to the second (high) degree of crystallization. Since different degrees of crystallization imply different electrical resistances, the sense amplifier 1108 is capable of determining the memory state of one of the phase changing memory cells 1106 depending on the resistance of the phase changing material.

To achieve high memory densities, the phase changing memory cells 1106 may be capable of storing multiple bits of data, i.e., the phase changing material may be programmed to more than two resistance values. For example, if a phase changing memory cell 1106 is programmed to one of three possible resistance levels, 1.5 bits of data per memory cell can be stored. If the phase changing memory cell is programmed to one of four possible resistance levels, two bits of data per memory cell can be stored, and so on.

The embodiment shown in FIG. 11 may also be applied in a similar manner to other types of resistivity changing memory cells like programmable metallization cells (PMCs), magento-resistive memory cells (e.g., MRAMs) or organic memory cells (e.g., ORAMs).

Another type of resistivity changing memory cell may be formed using carbon as a resistivity changing material. Generally, amorphous carbon that is rich is $sp^3$-hybridized carbon (i.e., tetrahedrally bonded carbon) has a high resistivity, while amorphous carbon that is rich in $sp^2$-hybridized carbon (i.e., trigonally bonded carbon) has a low resistivity. This difference in resistivity can be used in a resistivity changing memory cell.

In one embodiment, a carbon memory cell may be formed in a manner similar to that described above with reference to phase changing memory cells. A temperature-induced change between an $sp^3$-rich state and an $sp^2$-rich state may be used to change the resistivity of an amorphous carbon material. These differing resistivities may be used to represent different memory states. For example, a high resistance $sp^3$-rich state can be used to represent a "0," and a low resistance $sp^2$-rich state can be used to represent a "1." It will be understood that intermediate resistance states may be used to represent multiple bits, as discussed above.

Generally, in this type of carbon memory cell, application of a first temperature causes a change of high resistivity $sp^3$-rich amorphous carbon to relatively low resistivity $sp^2$-rich amorphous carbon. This conversion can be reversed by application of a second temperature, which is typically higher than the first temperature. As discussed above, these temperatures may be provided, for example, by applying a current and/or voltage pulse to the carbon material. Alternatively, the temperatures can be provided by using a resistive heater that is disposed adjacent to the carbon material.

Another way in which resistivity changes in amorphous carbon can be used to store information is by field-strength induced growth of a conductive path in an insulating amorphous carbon film. For example, applying voltage or current pulses may cause the formation of a conductive $sp^2$ filament in insulating $sp^3$-rich amorphous carbon. The operation of this type of resistive carbon memory is illustrated in FIGS. 12A and 12B.

Figure 12A:
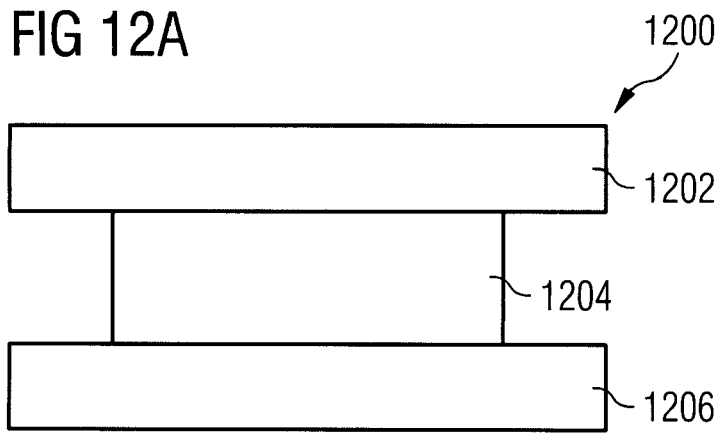
FIG. 12A shows a cross-sectional view of a carbon memory cell set to a first switching state.
Figure 12B:
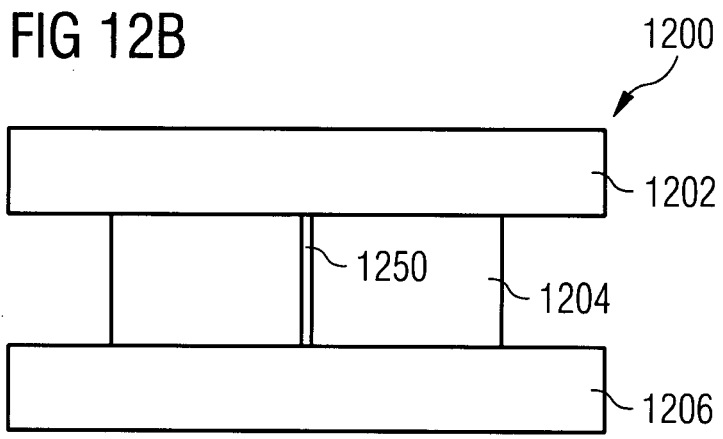
FIG. 12B shows a cross-sectional view of a carbon memory cell set to a second switching state.

FIG. 12A shows a carbon memory cell 1200 that includes a top contact 1202, a carbon storage layer 1204 including an insulating amorphous carbon material rich in $sp^3$-hybridized carbon atoms, and a bottom contact 1206. As shown in FIG. 12B, by forcing a current (or voltage) through the carbon storage layer 1204, an $sp^2$ filament 1250 can be formed in the $sp^3$-rich carbon storage layer 1204, changing the resistivity of the memory cell. Application of a current (or voltage) pulse with higher energy (or, in some embodiments, reversed polarity) may destroy the $sp^2$ filament 1250, increasing the resistance of the carbon storage layer 1204. As discussed above, these changes in the resistance of the carbon storage layer 1204 can be used to store information, with, for example, a high resistance state representing a "0" and a low resistance state representing a "1." Additionally, in some embodiments, intermediate degrees of filament formation or formation of multiple filaments in the $sp^3$-rich carbon film may be used to provide multiple varying resistivity levels, which may be used to represent multiple bits of information in a carbon memory cell. In some embodiments, alternating layers of $sp^3$-rich carbon and $sp^2$-rich carbon may be used to enhance the formation of conductive filaments through the $sp^3$-rich layers, thus reducing the current and/or voltage that may be used to write a value to this type of carbon memory.

Figure 13A:
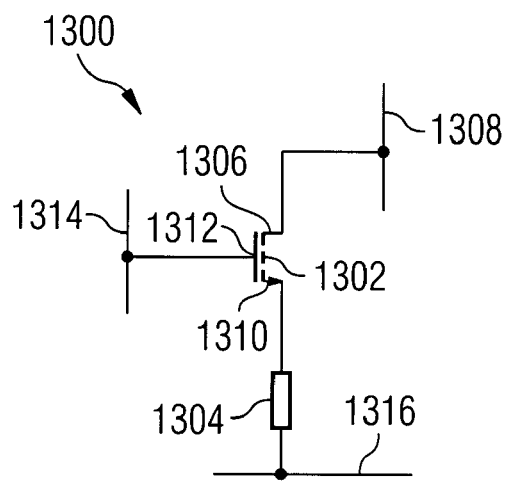
FIG. 13A shows a schematic drawing of a resistivity changing memory cell.

Resistivity changing memory cells, such as the phase changing memory cells and carbon memory cells described above, may include a transistor, a diode, or another active component for selecting the memory cell. FIG. 13A shows a schematic representation of such a memory cell that uses a resistivity changing memory element. The memory cell 1300 includes a select transistor 1302 and a resistivity changing memory element 1304. The select transistor 1302 includes a source 1306 that is connected to a bit line 1308, a drain 1310 that is connected to the memory element 1304, and a gate 1312 that is connected to a word line 1314. The resistivity changing memory element 1304 also is connected to a common line 1316, which may be connected to ground or to other circuitry, such as circuitry (not shown) for determining the resistance of the memory cell 1300, for use in reading. Alternatively, in some configurations, circuitry (not shown) for determining the state of the memory cell 1300 during reading may be connected to the bit line 1308. It should be noted that as used herein the terms connected and coupled are intended to include both direct and indirect connection and coupling, respectively.

To write to the memory cell 1300, the word line 1314 is used to select the memory cell 1300, and a current (or voltage) pulse on the bit line 1308 is applied to the resistivity changing memory element 1304, changing the resistance of the resistivity changing memory element 1304. Similarly, when reading the memory cell 1300, the word line 1314 is used to select the memory cell 1300, and the bit line 1308 is used to apply a reading voltage (or current) across the resistivity changing memory element 1304 to measure the resistance of the resistivity changing memory element 1304.

Figure 13B:
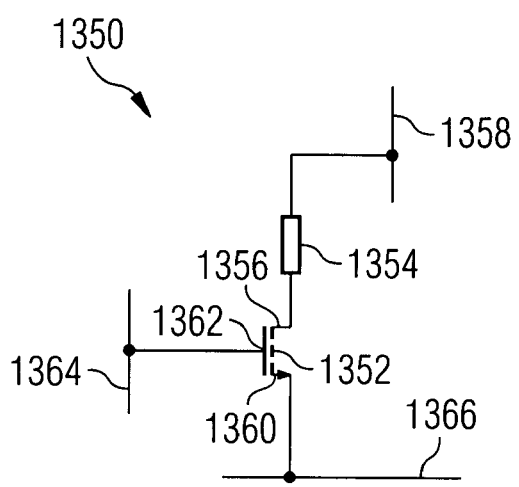
FIG. 13B shows a schematic drawing of a resistivity changing memory cell.

The memory cell 1300 may be referred to as a 1T1J cell, because it uses one transistor and one memory junction (the resistivity changing memory element 1304). Typically, a memory device will include an array of many such cells. It will be understood that other configurations for a 1T1J memory cell or configurations other than a 1T1J configuration may be used with a resistivity changing memory element. For example, in FIG. 13B, an alternative arrangement for a 1T1J memory cell 1350 is shown, in which a select transistor 1352 and a resistivity changing memory element 1354 have been repositioned with respect to the configuration shown in FIG. 13A. In this alternative configuration, the resistivity changing memory element 1354 is connected to a bit line 1358 and to a source 1356 of the select transistor 1352. A drain 1360 of the select transistor 1352 is connected to a common line 1366, which may be connected to ground or to other circuitry (not shown) as discussed above. A gate 1362 of the select transistor 1352 is controlled by a word line 1364.

According to one embodiment of the present invention, it is desirable to improve the quality and reproducibility of integrated circuits having resistivity changing memory devices.

In the following description, further aspects of exemplary embodiments of the invention will be explained.

According to one embodiment of the present invention, the chalcogenide material is encapsulated with an adequate film in order to prevent non-desirable photo-dissolution for CBRAM applications. In this way, a possible evolution of photo-dissolution during the fabricating process of a solid electrolyte memory device after a PL patterning process is prevented.

Under current processing, the CBRAM process after a photo-dissolution process has no control of the UV emission. And without any control of the UV emission (plasma process, litho tool, etc.) the photo-dissolution of silver (or another material) into the chalcogenide material will change and will influence reproducibility issues concerning reading processes of the memory cells.

According to one embodiment of the present invention, a dielectric layer (protection layer) is implemented in the ILD (inter layer dielectric) layer after a photo-dissolution process and after etching a composite structure including a chalcogenide layer and a top electrode layer ("PL etch"), the dielectric layer having characteristics to protect against electromagnetic waves of UV1 to UV4.

The photo dissolution protection layer (like Darc $SiH_4$, $N_2$) can be deposited just after the PL etch or can be included in the ILD layer deposition. With this new layer deposited, no photo-dissolution will occur during end wafer processes.

According to one embodiment of the present invention, in the ILD (inter layer dielectric) layer post photo-dissolution and post PL etch a dielectric layer is implemented with the characteristic to protect from the emission of electromagnetic waves of UV1 to UV4.

The layer (such as Darc $SiH_4$, $N_2$) can be deposited just after the PL etch or can be included in the ILD layer deposition.

As used herein, the terms "connected" and "coupled" are intended to include both direct and indirect connection and coupling, respectively.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. A method of manufacturing an integrated circuit comprising a resistivity changing memory device, the method comprising:
   providing a composite structure comprising a resistivity changing layer and an electrode layer being arranged on or above the resistivity changing layer; and
   providing a protection layer on or above the composite structure, the protection layer protecting the electrode layer against electromagnetic waves having a wavelength lying between 150nm to 400nm.

2. The method according to claim 1, wherein the protection layer protects the electrode layer against electromagnetic waves that cause metal ions of the electrode layer to move out of the electrode layer into the resistivity changing layer.

3. The method according to claim 1, further comprising performing a doping process in order to dope the resistivity changing layer with metallic material, the doping process being performed before providing the protection layer.

4. The method according to claim 3, wherein the doping process is performed after providing the composite structure, the doping process being based upon a photo-dissolution process that drives metal ions out of the electrode layer into the resistivity changing layer.

5. The method according to claim 3, wherein the light protection layer is provided on the composite structure immediately after doping the resistivity changing layer.

6. The method according to claim 1, wherein the protection layer protects the electrode layer against ultraviolet light.

7. The method according to claim 1, wherein the protection layer absorbs at least a part of the electromagnetic waves.

8. The method according to claim 1, wherein the protection layer reflects at least a part of the electromagnetic waves.

9. The method according to claim 1, wherein the protection layer comprises $SiH_4$ and/or $N_2$.

10. The method according to claim 1, further comprising an inter layer dielectric layer on or above the composite structure, the inter layer dielectric layer comprising a material component protecting the electrode layer against the electromagnetic waves.

11. The method according to claim 1, wherein the protection layer has a thickness of at least 20 nm.

12. The method according to claim 11, wherein the protection layer has a thickness between 20 nm and 400 nm.

13. The method according to claim 1, wherein the protection layer is provided on the electrode layer.

14. The method according to claim 1, wherein the protection layer is provided such that it covers sidewalls of the electrode layer.

15. The method according to claim 14, wherein the protection layer is provided such that it covers sidewalls of the electrode layer and the resistivity changing layer.

16. A method of manufacturing an integrated circuit comprising a resistivity changing memory device, the method comprising:
 providing a composite structure comprising a resistivity changing layer and an electrode layer being arranged on or above the resistivity changing layer; and
 providing a protection layer on or above the composite structure, the protection layer protecting the areas of the electrode layer shielded by the protection layer against electromagnetic waves having a wavelength lying between 150nm to 400nm.

\* \* \* \* \*